United States Patent [19]
Arnold et al.

[11] 4,025,916
[45] May 24, 1977

[54] BATTERY CONDITION MONITORING METHOD AND APPARATUS

[75] Inventors: John B. Arnold, Seville; John M. Bowyer, Copley; Howard R. Hegbar; Archie B. Shaefer, both of Akron, all of Ohio

[73] Assignee: Goodyear Aerospace Corporation, Akron, Ohio

[22] Filed: Oct. 14, 1975

[21] Appl. No.: 622,202

[52] U.S. Cl. .................................. 340/249; 320/48
[51] Int. Cl.² ........................................ G08B 21/00
[58] Field of Search ........... 340/249, 248 B, 253 C; 324/29.5; 320/48; 307/10 BP

[56] References Cited
UNITED STATES PATENTS

| 3,500,167 | 3/1970 | Applegate et al. ............ 340/249 X |
| 3,621,359 | 11/1971 | Schnegg ........................ 340/249 X |

*Primary Examiner*—John W. Caldwell
*Assistant Examiner*—Daniel Myer
*Attorney, Agent, or Firm*—Oldham & Oldham

[57] ABSTRACT

A battery condition monitoring device and technique which senses battery terminal voltage at a predetermined time period after initial loading of the battery and determines battery condition as a result of such tests. A function of the terminal voltage is created and the time period determined by the length of time required for that function to reach a predetermined level. The test is performed on the slope of the terminal voltage transient.

12 Claims, 5 Drawing Figures

BATTERY CONDITION MONITORING METHOD AND APPARATUS

BACKGROUND OF THE INVENTION

Wet cell rechargeable batteries or secondary batteries such as lead-acid, silver-cadmium, nickel-cadmium, and silver-zinc deteriorate with age and usage because the plates shed active material and are chemically and mechanically altered during the charge-discharge cycles of normal operation. Such gradual deterioration ultimately results in a device that no longer can retain a useful charge of sufficient capacity to carry its normal load. The inconvenience of sudden and unanticipated battery failure is well known to operators of automobiles, aircraft, industrial traction trucks, and military vehicles. A battery-condition monitor that indicates the state of deterioration and which is capable of signalling the approaching end of useful life provides a useful expedient to the users of equipment dependent upon the proper operation of associated rechargeable batteries.

Heretofore, numerous approaches have been taken to provide a device capable of indicating the state of deterioration of such batteries. Approaches have been taken wherein a test for the conductivity of the electrodes of the battery is run since such conductivity changes with cycling and charge. Such an approach is set forth in U.S. Pat. No. 2,988,590. Yet other devices have been proposed such as in U.S. Pat. No. 3,065,827 wherein voltage sensitive devices such as relays are provided to actuate charge indication means, such as lights, if the battery voltage is above or below a particular level. A similar approach, utilizing a warning light, is presented in the U.S. Pat. No. 3,118,137 wherein an electronic circuit is connected across the terminals of a battery to continually monitor the terminal voltage thereof and determine the state of the charge remaining in the battery as a function of the terminal voltage. This prior art structure requires a constant monitoring of the battery potential and consequent battery drain along one of two discharge paths.

Many other techniques and devices for the testing of battery conditions have been proposed wherein the specific gravity and/or chemical composition of the battery electrolyte is tested. Such tests are generally complex, inaccurate, and conducive only to a manual rather than an automatic mode of operation. Other techniques of electronic analysis of battery condition are proposed in U.S. Pat. Nos. 3,484,681; 3,500,167; 3,503,062; 3,529,230; 3,550,105; and 3,832,629. While these references are of interest for purposes of general prior art concepts, the shortcomings thereof will be readily apparent in view of the embodiments of the instant invention presented herein.

It is an object of the instant invention to present a battery condition monitor for attachment to a vehicle battery and operative to test the condition of such battery at the instant of loading the same. This test is truly a measure of battery capability to service the existing load, at the instant of loading.

Still another object of the invention is to present a battery condition monitor wherein the transient voltage of the battery, under initial load, is tested and the general condition of the battery is determined thereby.

Yet another object of the invention is to verily subsystem integrity by testing loading situations that may be temporarily serviced by the battery but are detrimental to its service life.

Yet another object of the invention is to present a battery condition monitor wherein a basic testing technique on a lead cell battery is adaptable for any of numerous implementations.

Still a further object of the invention is to provide a battery condition monitor which is inexpensive to construct, reliable in operation, highly accurate in testing, has a low power standby posture, and, is conducive to implementation in any of a multitude of systems incorporating rechargeable batteries.

These objects and other objects which will become apparent as the detailed description proceeds are achieved by: A battery condition monitoring device for connection across the terminals of a rechargeable battery comprising: a function generator connected to the battery and producing an output signal as a function of the terminal voltage of the battery; a timing circuit connected between the battery and function generator for determining the time period for the output signal to reach a particular level; comparison means connected to said battery for comparing the terminal voltage at the end of said time period with preselected voltage references, the comparisons determining the condition of said battery; and display means connected to said comparison means for indicating the condition of said battery.

DESCRIPTION OF THE DRAWINGS

For a complete understanding of the objects, structure and techniques of the invention, reference should be had to the following detailed description and accompanying drawings wherein.

DETAILED DESCRIPTION OF PREFERRED EMBODIMENTS

A sensitive parameter of battery cell condition is the internal electrical resistance thereof. As are rechargeable battery ages and the plates shed active material, the internal resistance of the device increases from the original value when the battery was new and first placed in service. Measurement of terminal voltage regulation; that is the drop in terminal voltage under load, can yield an evaluation of internal resistance when ambient temperature and the characteristics of the load are properly accounted for. Measuring and evaluating the behavior of internal cell resistance as a function of battery life can yield as assessment of battery condition, aging, and the associated probable remaining life. In automobile and similar applications, and for large variations in ambient temperature and under conditions where a heavy loan is applied, it is convenient and appropriate to determined internal battery resistance in the time interval between starter switch contact closing and the instant of start motor rotation.

In the automobile applicaion, use of the initial current transient period following closing of the starter solonoid switch as a test cycle time provides several beneficial features. The monitoring device is only activated when the starter is operated, thus permitting avoidance of any substantial continuing battery drain by the monitoring device. Further, this initial blocked rotor starter current transient is a substantial load of several hundred amperes and the battery is tested near its maximum output. By proper choice of the turn-on and the end-of-test battery terminal voltage levels for circuit triggering, the test cycle can be restricted to the starter transient current period, thus avoiding activation of the monitor circuit by the normal loads of other auto electrical equipment.

Figure 1:
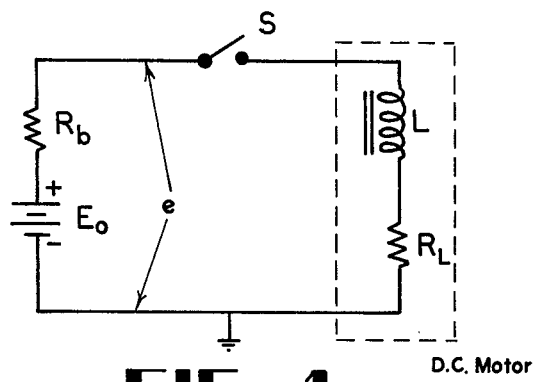
FIG. 1 is a schematic diagram of a battery-monitor circuit.

In automotive starting service, traction vehicles such as industrial fork-lift trucks and the like, a common circuit configuration exists which lends itself to the measurement of battery internal resistance under turn-on transient conditions. The configuration consists of a motor load suddenly switched across a battery. For convenience of analysis and discussion, individual cells will be treated as a series connected group comprising a single battery. A simplified substantially equivalent circuit prior to motor turn on consists of the series connection of a battery of voltage Eo and its internal resistance Rb separated by means of an open switch S (which could represent the starter solonoid switch) from the respective inductance and resistance of the starter motor load L and R1. Such a circuit is shown in FIG. 1. Solving for the instanaeous value of current in terms of the EMF and impedences which exist prior to the time at which the motor rotor just commences to rotate, some insight into the transient behavior of the circuit of FIG. 1 can be had.

Summing for the EMF's about the circuit by use of Kirchoff's Voltage Law:

$Eo - iRb = iRl + Ldi/dt$
$Eo = i(Rb + Rl) + Ldi/dt$
$i = [Eo/(Rb + Rl)][1 - \exp(-Rb - Rl)5/L]$ where (exp) = Napierian Logarithm base.

In reference to FIG. 1 it should be apparent that $e = Eo - iRb$. Since $Eo$ is constant as may be assumed for an idealized battery, $e$ varies as a function of current $i$ because of $Rb$, the apparent internal battery resistance. The regulation under load or drop in terminal voltage is thus:

$Eo - e = iRb = eb$

Figure 2:
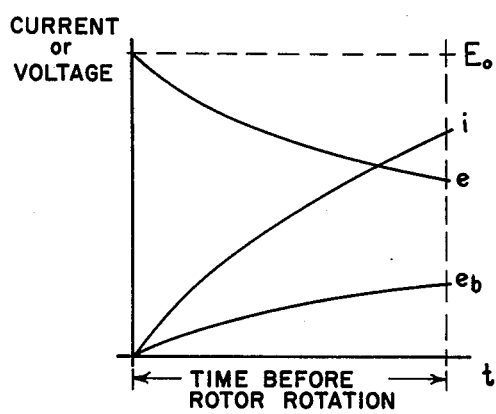
FIG. 2 is a response curve of the circuit parameters of FIG. 1 at the moment the battery is loaded.

The behavior of $i, e$ and $eb$ as a function of time is shown in FIG. 2, although it should be noted that the equations presented hereinabove and the graph of FIG. 2 is only valid for the locked-rotor case; that short time interval prior to rotor movement. When the rotor starts to turn, a back EMF is generated and, in the automobile case, the generator EMF starts to appear on the bus and thus the equations become invalidated by the introduction of these EMF's in addition to $Eo$.

It should be apparent that a change only in $Rb$ will cause a change in the current $i$, the terminal voltage $e$, and the internal battery drop $eb$. Measurement of these changes as influenced by $Rb$ and the assessment of the measured values forms a basis for the methods and structures of the inventions presented herein. The apparent internal electrical resistance $Rb$ of a battery has the smallest value when the battery is new, fully charged, and properly filled with electrolyte. The value of $Rb$ will increase due to aging of the battery, lack of charge in one or more cells, and a low level of electrolyte below the top of the cell plates. It should be noted that when the terminal voltage $e$, for the methods to be presented, is measured in the vehicle's circuit and not directly at the battery posts, the cable and cable terminal clamps can add enough resistance so as to increase the measured $Rb$ to a value that will yield a battery condition assessment below that which actually exists.

The methods and associated structures presented and described herein are intended to operate during the load current transient interval immediately following Turn-On. Although these methods treat the cells of the battery as a serially connected 2-terminal group, it should be understood that the principals, methods, and structures are applicable to individual cells taken singly or in any combination.

Further, since direct measurement of the battery current is difficult to achieve since the same involves inserting a current sensitive device or fixed resistor into the circuit, it has been found to be expedient to make voltage measurements at the cell or battery terminals. Therefore, the methods presented hereinbelow utilize the battery terminal voltage as the input to the monitoring device and its circuits. In the methods described for measurement and assessment of $Rb$ and the associated battery condition, the circuits are triggered and activated when a preset function of the terminal voltage drops to an initial threshold level. At that instant in time, the terminal voltage is tested against preselected references and graded upon the basis of such tests.

There are presented several methods and structures for achieving the objects of the inventions wherein battery terminal voltage is measured at a particular instant in time for the assessment of $Rb$ and the associated battery condition. In each of the methods, a function $F(e)$ of the battery terminal voltage is created by the circuits. $F(e)$ varies with the transient and when $F(e) = C$ (a preset constant value) the battery terminal voltage is measured and compared to preset reference values to yield the assessment of $Rb$ and the corresponding battery condition. It will be noted that $F(e)$ is unique for each of the various methods and structures as are the preset constant values.

Presented below are three embodiments of the invention, each being set forth and described in terms sufficient to enable one skilled in the art to make and practice the same. While specific circuit elements are not set forth in great detail, it is believed that the terms used for identifying each such element are sufficient to denote specific structure to one skilled in the art. If further elaboration is necessary for any such element, reference should be had to copending patent application Ser. No. 622,200, filed Oct. 14, 1975 by the applicants herein, and entitled BATTERY CONDITION MONITORING METHOD AND APPARATUS wherein certain specific circuit elements conductive to implementation in the instant invention are described.

EMBODIMENT I

Figure 3:
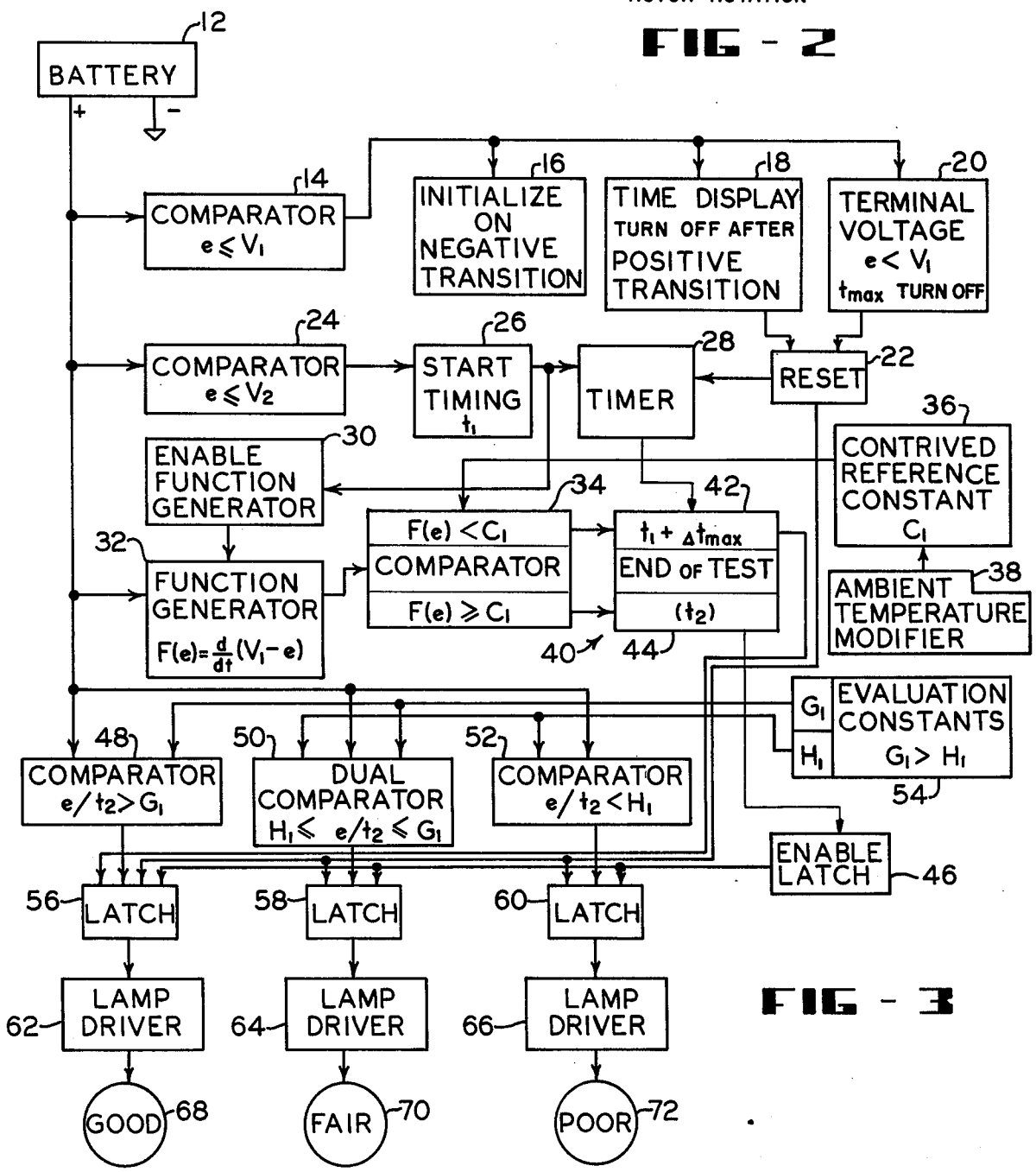
FIG. 3 is a block diagram of the circuitry comprising a first embodiment of the invention.

Referring now to FIG. 3, an embodiment 10 of the structure of the invention may be seen. Here a wet cell battery 12 with negative ground has the positive terminal thereof connected to a comparator 14 which is operative to produce an output when the battery terminal voltage $e$ is equal to or less than a preselected value V1. Such an output from the comparator 14, occurs on the negative transition of the battery terminal voltage upon loading. An output from the comparator 14 initializes the remaining circuitry on the negative transition of the transient voltage and, on the positive transition thereof, is operative to turn off the time display via element 18 and reset latch 22. Further, if the terminal voltage does not recover above V1, then after a maximum amount of display time has run, the system is reset via elements 20, 22.

When the battery terminal voltage $e$ drops below a second level V2 as determined by comparator 24, the circuit 26, which could be a standard R-S flip flop, starts a timer 28 and enables the function generator 32 via the enable circuit 30. In the embodiment under consideration the function of the battery terminal voltage $F(e)$ is equal to the first derivative with respect to time of (V1-$e$). Consequently, the element 32 could be a standard differentiating circuit. The output of the element 32 is passed to the comparator 34 and a comparison there made against a reference constant C1 supplied by a voltage divider reference source or the like 36. Ambient temperature compensation is provided by means of the element 38 and may be supplied in any of numerous manners as is well known to those skilled in the art. The end of the test is determined at 40 based upon either of two criteria supplied via the comparator 34. If the voltage function generated at 32 does not equal or exceed the reference value C1 after a fixed period of time as determined by the timer 28, an output via 42 is supplied to the latch 56 which, as will be discussed hereinafter, designates the battery as being "good". If the voltage function output of 32 does indeed equal or exceed the constant C1 within the aforementioned period of time, the time $t2$ at which the function equalled C1 is determined from the timer 28 at 44 and, at that time, the latch enable circuit 46 (which again could be a flip flop) is actuated to enable the latches 56–60 to be discussed hereinafter.

Comparators 48, 50 and 52 receive the battery terminal voltage $e$ from the battery 12. Also supplied to the comparators 48–52 are evaluation constants from the source 54 which may be an appropriate voltage divider network. Two constants are supplied, G1 and H1, wherein the former is greater than the latter. Comparator 48 presents an output while the battery terminal voltage $e$ is greater than the larger constant G1 and similarly, the comparator 52 presents an output while the terminal voltage $e$ is less than the smaller constant H1. The comparator 50 is a dual comparator which presents an output during that period of time that the battery terminal voltage $e$ lies between or equals the two constants G1 and H1.

Latches 56, 58 and 60 receive the respective outputs of the comparators 48–52 as shown and are appropriately enabled by the latch enable circuit 48 discussed above. The latch enable circuit is actuated at the time $t2$ defined by the comparator 34. Consequently, the latches 56–60 are operative to mutually exclusively present outputs based upon the value of the battery terminal voltage at the time $t2$. These latches drive respective lamp drivers 62, 64 and 66 which in turn actuate respective lamps or other grading means 68, 70 and 72. It should be readily appreciated by those skilled in the art that the battery terminal voltage $e$ will exceed the higher evaluation constant G1 for a good battery, fall below the lower evaluation constant H1 for a poor battery, and fall between these two levels for a fair battery.

It should of course be recognized that the lamps or other indicating and grading means 68–72 may be positioned within the view of the vehicle operator so as to apprise him of battery condition. The latches 56–60 are reset via 22 on the positive transition of the battery after the engine has started or, in the case mentioned above with respect to block 20, after a maximum period of time if the terminal voltage has not recovered above the level V1. Consequently, the operator may note his battery condition during the period of loading the same.

EMBODIMENT II

Figure 4:
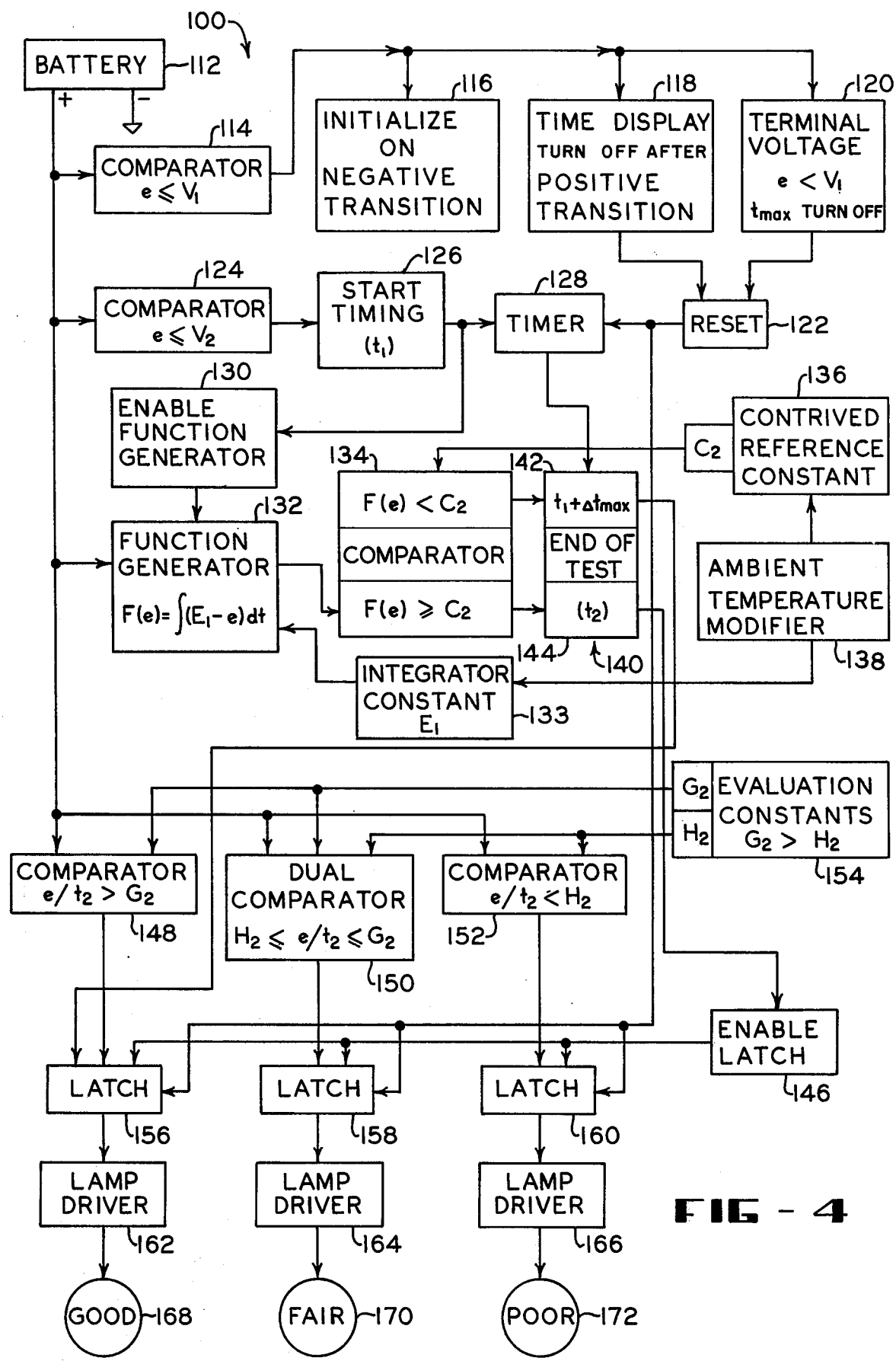
FIG. 4 is a block diagram of the circuitry comprising a second embodiment of the invention.

Referring now to FIG. 4, there may be had an understanding of yet another embodiment of the structure of the invention as designated by the numeral 100. It should be readily apparent that the structure of this embodiment is quite similar in nature to that presented by the embodiment of FIG. 3 wherein corresponding elements are designated with numerals increased by a value of 100; that is, the comparator 114 of FIG. 4 corresponds to the comparator 14 of FIG. 3 and so forth.

It should be noted that the function generator 132 of this embodiment provides an integrating function; the integral of the difference between a fixed voltage level E1 supplied from the integrator constant circuit 133 and the battery terminal voltage $e$. The characteristic of the integral output of 132 determines the time $t2$ at which the comparison is made via 148–152 of the battery terminal voltage with evaluation constants G2 and H2 supplied from 154. The latches, lamp drivers, and lamps or indication means 156–172 operate in the manner aforementioned.

EMBODIMENT III

Figure 5:
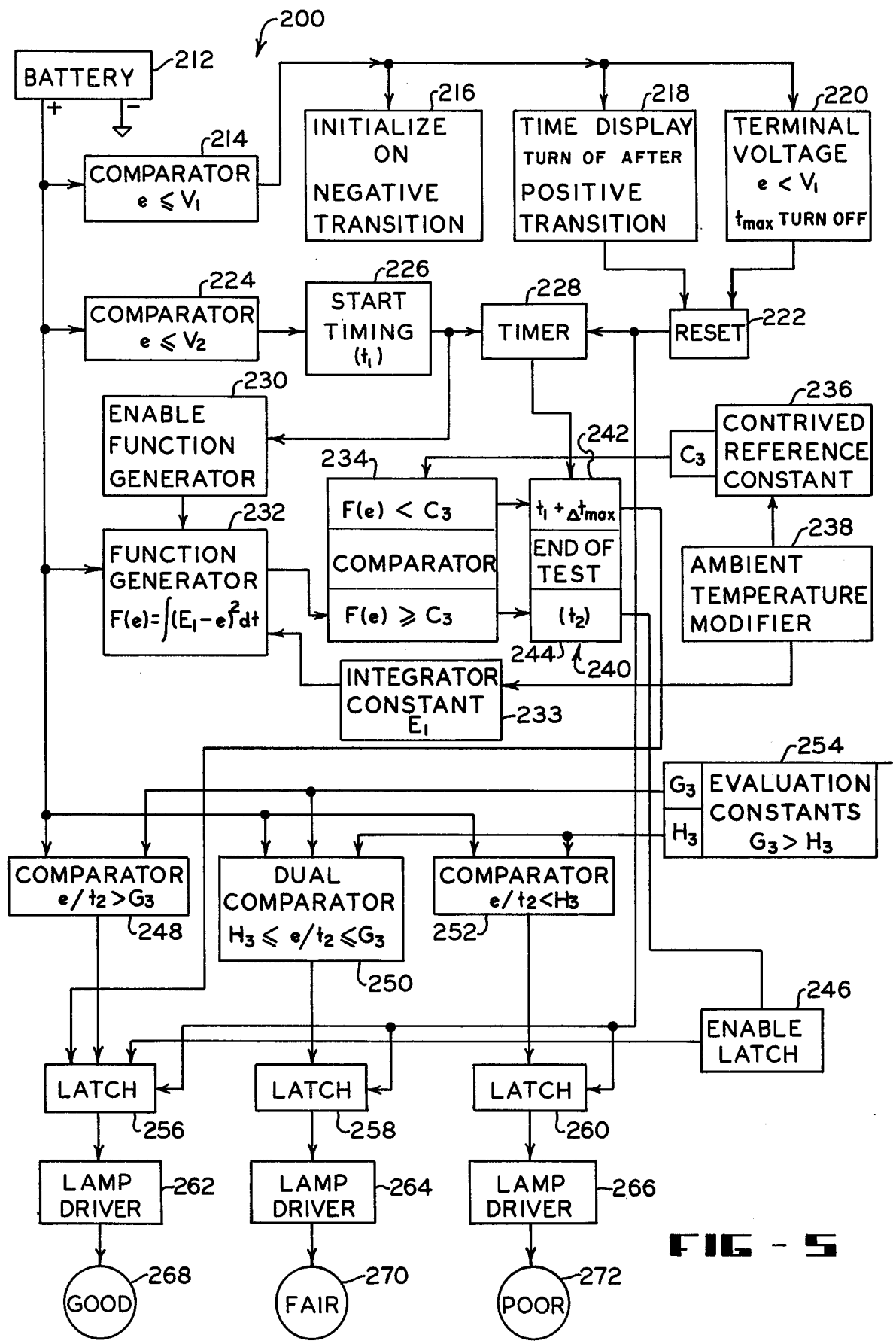
FIG. 5 is a block diagram of the circuitry comprising a third embodiment of the invention.

An understanding of the structure of yet a third embodiment of the invention may be had by reference to FIG. 5. This embodiment designated generally by the numeral 200, is quite similar in nature to the structures presented in FIGS. 3 and 4 but for the character of the function generator 232. Here, the function of battery terminal voltage is the time integral of the square of the function created by the structure of FIG. 4. For all intents and purposes the remainder of the circuitry herein is functionally identical to that of those described in the other two embodiments. The constants G3 and H3 supplied by the circuit 254 for comparison against the battery terminal voltage $e$ at time $t2$ provides the criteria for excitation of the respective lamps 268–272.

It should now be readily apparent that any of numerous function generators might be utilized for purposes of achieving the objects of the instant invention. It is only important that the function generator produce an output which may be utilized to determine at time at which the battery terminal voltage may be sensed for purposes of exciting the appropriate lamp or other grading means.

While in accordance with the patent statutes only the best mode and preferred embodiments of the invention have been presented and described in detail, it is to be understood that the invention is not limited thereto or thereby. Consequently, for an appreciation of the scope and breadth of the invention, reference should be had to the following claims.

What is claimed is:

1. A device for monitoring the condition of a dry cell battery, comprising:
   an external load in sensitive engagement with the battery;
   a function generator connected to the battery and creating an output voltage as a function of battery terminal voltage;
   timing means connected to the battery and the function generator for starting a timing period after application of said external load to the battery when the battery terminal voltage drops at a first level and terminating such period when the output voltage reaches a second level;
   comparator means interconnected between the battery and the timing means for comparing the battery terminal voltage against preselected levels at the end of the test period and producing an output signal indicative of such comparison.

2. The device as recited in claim 1 which further includes indicator means connected to the comparator means for receiving the output signal thereof and producing indicia of battery condition.

3. The device as recited in claim 2 wherein said comparator means includes a plurality of comparator circuits each comparing the battery terminal voltage with a fixed level, annd each such comparator circuit being connected to a separate latch circuit and operative to actuate such latch circuit according to the comparison made, outputs of the latch circuits feeding the indicator means.

4. The device as recited in claim 3 wherein the latch circuits are connected to the timing means and enabled by a pulse from the timing means at the end of the test period.

5. The device as recited in claim 1 wherein the function generator comprises a differentiating circuit.

6. The device as recited in claim 1 wherein the function generator comprises an integrating circuit.

7. A circuit for monitoring the charge-retaining capability of a rechargeable wet cell battery, comprising:
   an external load in selective engagement with the battery;
   a timing circuit connected to the battery and beginning a test period upon the battery terminal voltage reaching a particular level;
   a function generator means connected to the battery and the timing circuit for producing an output signal as a function of the battery terminal voltage, the output of the function generator determining the end of the test period when said output reaches a predetermined level;
   comparator circuits connected to the battery, comparing the battery terminal voltage at the end of the test period with preselected levels and producing outputs corresponding to such comparisons; and
   indicator means connected to the comparator circuits and receiving the output signals thereof for producing visual indicia of battery condition.

8. The circuit as recited in claim 7 wherein the indicator means comprises a latch connected to each comparator circuit and connected to the timing circuit, and the latches being enabled by the timing circuit and actuated by the outputs of the comparator circuits.

9. The circuit as recited in claim 8 wherein the latches are interconnected to reset means such that, upon actuation, the latches remain set for only a fixed duration of time.

10. The circuit as recited in claim 7 wherein the indicator means comprises a lamp interconnected with each comparator circuit.

11. The circuit as recited in claim 7 wherein the function generator means comprises an integrator circuit.

12. The circuit as recited in claim 7 wherein the function generator means comprises a differentiator.

* * * * *

UNITED STATES PATENT OFFICE
CERTIFICATE OF CORRECTION

Patent No. 4,025,916  Dated May 24, 1977

Inventor(s) John B. Arnold, John M. Bowyer, Howard R. Hegbar, and Archie B. Shaefer It is certified that error appears in the above-identified patent and that said Letters Patent are hereby corrected as shown below:

Column 2, line 50, "are" should be corrected to read --a--.

Column 2, line 60, "as" should be corrected to read --an--.

Column 7, Claim 1, line 3, "sensitive" should be corrected to read --selective--.

Column 7, Claim 1, line 11, "at" should be corrected to read --to--.

Signed and Sealed this

First Day of November 1977

[SEAL]

Attest:

RUTH C. MASON
Attesting Officer

LUTRELLE F. PARKER
Acting Commissioner of Patents and Trademarks